US012765080B2

(12) United States Patent
Runge et al.

(10) Patent No.: US 12,765,080 B2
(45) Date of Patent: Oct. 13, 2026

(54) PHOTODIODE AND METHOD OF FABRICATING A PHOTODIODE

(71) Applicant: Fraunhofer-Gesellschaft zur Förderung der angewandten Forschung e.V., Munich (DE)

(72) Inventors: Patrick Runge, Berlin (DE); Tobias Beckerwerth, Berlin (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 804 days.

(21) Appl. No.: 18/031,909

(22) PCT Filed: Oct. 14, 2021

(86) PCT No.: PCT/EP2021/078424
§ 371 (c)(1), (2) Date: Apr. 14, 2023

(87) PCT Pub. No.: WO2022/079157
PCT Pub. Date: Apr. 21, 2022

(65) Prior Publication Data

US 2023/0369527 A1 Nov. 16, 2023

(30) Foreign Application Priority Data

Oct. 16, 2020 (EP) .................................... 20202324

(51) Int. Cl.

| | |
|---|---|
| ***H10F 30/223*** | (2025.01) |
| ***H10F 71/00*** | (2025.01) |
| ***H10F 77/124*** | (2025.01) |

(52) U.S. Cl.
CPC ....... *H10F 30/223* (2025.01); *H10F 71/1272* (2025.01); *H10F 77/1248* (2025.01)

(58) Field of Classification Search
CPC ............... H10F 30/223; H10F 71/1272; H10F 77/1248; H10F 77/206
See application file for complete search history.

(56) References Cited

U.S. PATENT DOCUMENTS 4,346,394 A * 8/1982 Figueroa ............ H10F 30/2843 257/187
5,322,573 A * 6/1994 Jain .................... H10F 77/1248 257/E31.022

(Continued)

FOREIGN PATENT DOCUMENTS

JP 2016213362 A 12/2016
WO 2014002082 A2 1/2014

OTHER PUBLICATIONS

Leite et al., "InAlAs Epitaxial Growth for Wide Band Gap Solar Cells," IEEE Photovoltaic Specialists Conference, 2011, 4 pages.

(Continued)

*Primary Examiner* — Andres Munoz
(74) *Attorney, Agent, or Firm* — The Webb Law Firm

(57) ABSTRACT

Provided is a photodiode, including a substrate formed by a III-V semiconductor material. The substrate is made of InP; at least one light absorption layer; and at least one doped contact layer. The absorption layer is to be illuminated through the contact layer. The contact layer includes a semiconductor material having an indirect band gap and has a thickness of at least 200 nm.

20 Claims, 1 Drawing Sheet

(56) References Cited

U.S. PATENT DOCUMENTS

| | | | | |
|---|---|---|---|---|
| 6,262,465 | B1 | 7/2001 | Williamson et al. | |
| 6,350,998 | B1 | 2/2002 | Tsuji | |
| 6,740,908 | B1 | 5/2004 | Giboney | |
| 10,401,543 | B1 | 9/2019 | Shi | |
| 2005/0184308 | A1 | 8/2005 | Dutta | |
| 2011/0248316 | A1 * | 10/2011 | Bois | H10F 77/1248<br>438/94 |

OTHER PUBLICATIONS

Liu et al., "Wide Spectral Range InP-based Photodetectors with High Speed," Asia Communications and Photonics Conference, 2015, 3 pages.
Mathews et al., "INALAS and INGAAS Solar Cell Development for Use in Monolithic Triple-Junction Solar Cells with Improved Spectrum Splitting", 28th European Photovoltaic and Solar Energy Conference, 2013. 6 pages.
Shi et al., "Large-area InP Based Photodiode Operated at 850 nm Wavelengths with High Efficiency and High Speed for 40 Gbit/sec Transmission", IEEE Photonics Conference, 2014, pp. 198-199.
Ünlü et al., "Resonant Cavity Enhanced Photonic Devices," Journal of Applied Physics, 1995, pp. 607-639, vol. 78, No. 2.

* cited by examiner

PHOTODIODE AND METHOD OF FABRICATING A PHOTODIODE

CROSS-REFERENCE TO RELATED APPLICATIONS

This application is the United States national phase of International Patent Application No. PCT/EP2021/078424, filed on Oct. 14, 2021, and claims priority to European Patent Application No. 20202324.8, filed on Oct. 16, 2020, the disclosures of which are hereby incorporated by reference in their entireties.

BACKGROUND OF THE INVENTION

Field of the Invention

The disclosure relates to a photodiode and a method of fabricating a photodiode.

Description of Related Art

Photodiodes, in particular surface illuminated photodiodes, on the basis of III-V semiconductor materials are known as receivers in e.g. optical communication systems. For example, the article "Large-Area InP Based Photodiode Operated at 850 nm Wavelengths with High Efficiency and High Speed for 40 Gbit/sec Transmission", Jin-Wei Shi et al., 2014 IEEE Photonics Conference, San Diego, CA, 2014, pp. 198-199, doi: 10.1109/IPCon.2014.6995316 discloses a surface illuminated indium phosphide photodiode. A top p-doped contact layer of InAlAs is used. However, that material has a band gap of 1.47 eV (corresponding to a wavelength of about 840 nm) and thus e.g. does not allow transmission of light having wavelengths in the region of 780 nm. Moreover, in order to allow a low resistance contact, the contact layer has to have a rather large thickness, which in turn, increases unwanted absorption in the contact layer.

SUMMARY OF THE INVENTION

The problem underlying the proposed solution is to provide a high-speed photodiode capable of efficient detection of lower wavelengths.

According to the solution, a photodiode (in particular a surface illuminated photodiode being illuminated via a contact surface) is provided, comprising

- a substrate formed by a III-V semiconductor material, wherein the substrate is made of InP;
- at least one light absorption layer; and
- at least one doped contact layer, wherein the absorption layer is to be illuminated through the contact layer, wherein
- the contact layer comprises or consists of a semiconductor material having an indirect band gap and has a thickness of at least 200 nm.

Using a semiconductor material with an indirect band gap as the (e.g. top) contact layer reduces or eliminates absorption of light having a wavelength e.g. lower than 840 nm. As a consequence, the generation of electron-hole pairs in the contact layer is reduced or eliminated resulting, in turn, in a faster carrier transport and thus in a higher bandwidth of the photodiode.

The substrate is, for example, a semi-insolating semiconductor.

The (e.g. low bandgap) contact layer at least partially may form an outer (in particular top) surface of the photodiode such that light to be detected by the photodiode is irradiated onto the contact layer and transmitted through the contact layer into the absorption layer. According to an embodiment of the solution, the contact layer is p-doped for forming a p-contact of the photodiode. However, it is also possible that the contact layer is an n-doped layer used for realizing an n-contact of the photodiode.

For example, a lattice mismatch of the semiconductor material of the contact layer and the semiconductor material of the substrate does not exceed +/−750 ppm. The contact layer may comprise or consist of a semiconductor material consisting of a composition that contains Al and/or Sb. More particularly, the semiconductor material of the contact layer may comprise or consist of a composition that contains Ga, As, Al and Sb and may be lattice matched to the substrate, where the lattice matching includes the range of +/−750 ppm. The content of Al may be at least 0.42. For example, the composition comprises or consists of AlGaAsSb, InAlAsSb or AlAsSb. The contact layer may have a thickness of at least 300 nm.

The photodiode may comprise or consist of at least one intrinsic semiconductor layer, wherein the photodiode according to the solution in particularly forms a p-i-n diode structure, wherein one of the contact layers need to be at least partially formed by an indirect bandgap material. At least one intrinsic layer may be placed between the contact layers. The intrinsic semiconductor layer may be an intrinsic InGaAs and/or GaAsSb layer. The thickness of the intrinsic semiconductor layer may not exceed 700 or 1000 nm. Further, the photodiode may comprise at least two absorption layers, wherein one of the absorption layers may be arranged adjacent the contact layer and/or may be a GaAsSb layer.

It is also possible that at least one additional layer is arranged between the contact layer and the absorption layer. For example, the additional layer is doped with the same type of dopant as the contact layer, wherein, however, the concentration of the dopant may be lower than or gradually decrease from the one of the contact layer. The additional layer may consists of a different material than the contact layer; in particular a material that does not have an indirect band gap such as GaAsSb or InGaAs. The thickness of the additional layer may be at least 200 or at least 300 nm. If the (depleted and/or undepleted) absorption layer comprises two material layers, e.g. a GaAsSb and a InGaAs layer, the GaAsSb layer may be located on the side (e.g. adjacent) to the contact layer with the indirect bandgap.

According to another embodiment of the solution, the photodiode may comprise an (e.g. undoped and/or partially depleted) collector layer with a corresponding bandgap above or close to the absorption wavelength of the absorption layer arranged on a n-contact side of the absorption layer. More particularly, the photodiode may form a unique travelling carrier (UTC) photodiode structure, when adding a doped wideband blocking layer between the absorption layer and the (in this case p-doped) contact layer.

Moreover, the photodiode in particular comprises a metal contact (e.g. at least one metal layer) in electrical contact with the contact layer. The metal contact may be arranged directly on the contact layer or at least one semiconductor layer may be arranged between the metal contact and the contact layer. For example, the at least one semiconductor layer (having a thickness of e.g. at least 40 or 50 nm)

arranged between the metal contact and the contact layer may comprise or consist of a material having a small band gap.

The metal contact may cover only a part of the contact layer to allow the light to be illuminated onto the contact layer and the layers below the contact layer (in particular the absorption layer). For example, the metal contact forms an in aperture for the incoming light, wherein the metal contact may at least partially have the shape of a ring. If a semiconductor layer is arranged between the metal contact and the contact layer, that material may be arranged only below the metal contact and thus does not cover the contact layer outside the region of the metal contact.

According to a further embodiment of the solution, the doped contact layer may be a first contact layer and the photodiode may comprise a second contact layer doped complementary to the first contact layer and arranged on a side of the absorption layer facing away from the first contact layer. For example, the first contact layer is a p-doped layer for forming a p-contact and the second contact layer is an n-doped layer for forming an n-contact of the photodiode. The thickness of the second contact layer may be at least 250 or at least 500 nm. However, the opposite case is also conceivable, i.e. the first contact layer is an n-doped layer (e.g. for forming a top, front side n-contact) and the second contact layer is a p-doped layer.

Moreover, a layer with a composition grading may be arranged between two undepleted layers located between the first and the second contact layer.

The second contact layer may also comprise or consist of a semiconductor material having an indirect band gap in order to reduce or avoid absorption. It is also possible that the second contact layer comprises or consists of a semiconductor material having a large band gap (e.g. a band gap of at least 1.46 eV) such as InAlAs. Same material properties hold true for an intrinsic layer of the photodiode, being not necessary the absorption layer, e.g. a collector layer of the UTC embodiment of the claimed photodiode. Furthermore, the collector layer can be made of the material composition AlGaAsSb or InAlAsSb and/or could have an indirect bandgap.

According to another aspect of the solution, a photodiode, in particular as described above, is provided, comprising

- a substrate formed by a III-V semiconductor material;
- at least one light absorption layer;
- at least one doped first contact layer, wherein the absorption layer is to be illuminated through the contact layer;
- a second contact layer doped complementary to the first contact layer and arranged on a side of the absorption layer facing away from the first contact layer; and
- at least one undoped and/or partially depleted collector layer arranged on the side of the absorption layer facing towards the second contact layer, wherein
- the first contact layer comprises or consists of a semiconductor material having an indirect band gap.

The collector layer may be non-absorbing regarding an absorption wavelength of the absorption layer or may have a lower absorption regarding the absorption wavelength of the absorption layer than the absorption layer. For example, the collector layer may have a band gap having a band gap energy larger than an energy corresponding to the absorption wavelength of the absorption layer.

Moreover, the photodiode may comprise an additional absorption layer arranged between the first contact layer and the light absorption layer. For example, the photodiode has a unique travelling carrier (UTC) configuration as set forth above.

The embodiments disclosed above in conjunction with the first aspect of the solution can be similarly used to realize embodiments of the photodiode according to the second aspect of the solution. For example, the first contact layer may have a thickness of at least 200 nm. The photodiode according to the solution may be employed in an optical communication system, quantum communication/computation or for sensing applications.

The solution also relates to a method of fabricating a photodiode, in particular as described above, comprising the steps of:

- providing a substrate formed by a III-V semiconductor material, wherein the substrate is made of InP;
- generating at least one light absorption layer on the substrate; and
- generating at least one doped contact layer on the substrate in such a way that light is irradiatable into the absorption layer through the contact layer, wherein
- the contact layer comprises or consists of a semiconductor material having an indirect band gap and has a thickness of at least 200 nm.

The embodiments described above in conjunction with the photodiode according to the solution may of course be used to modify the above method.

BRIEF DESCRIPTION OF THE DRAWINGS

Embodiments of the solution are described in more detail below with reference to the drawings.

DESCRIPTION OF THE INVENTION

Figure 1:
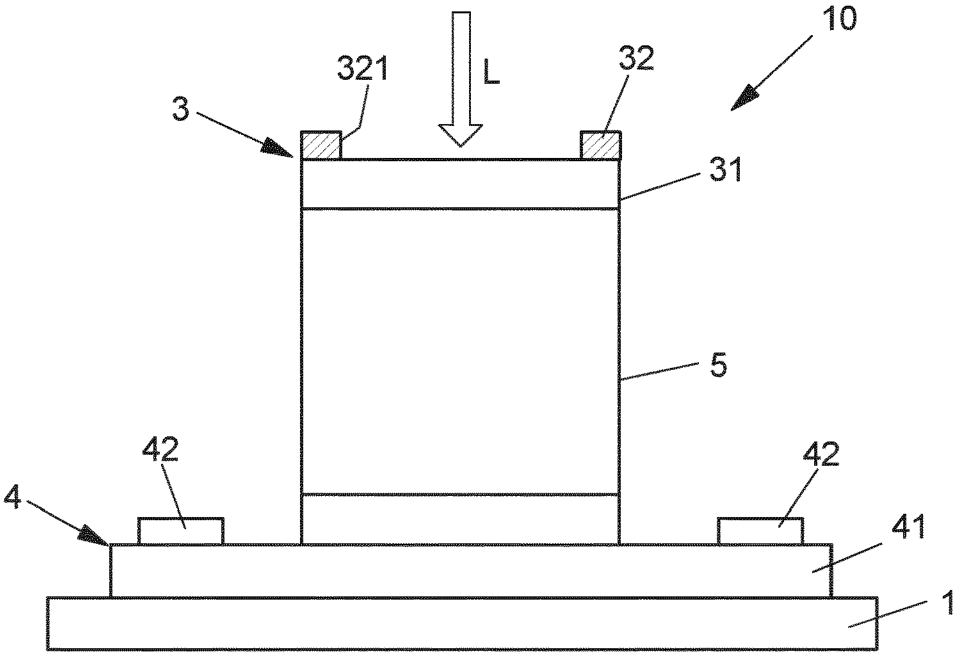
FIG. 1 shows schematically a sectional view of a photodiode according to a first embodiment of the solution.

The photodiode 10 according to the solution depicted in FIG. 1 is based on indium phosphide, i.e. it comprises an InP substrate 1. Moreover, the photodiode 10 has a p-i-n diode structure and as such comprises a p-contact region 3, an n-contact region 4 and an intrinsic absorption layer 5 arranged between p-contact region 3 and the n-contact region 4. According to FIG. 1, photodiode 10 is a surface illuminated diode, wherein the p-contact region 3 forms an upper (top) region of the photodiode 10 and the n-contact region 4 is arranged on the substrate 1, i.e. located between the substrate 1 and the absorption layer 5. Thus, light L to be detected by the photodiode 10 is to be irradiated onto p-contact region 3 and has to be transmitted through the p-contact region 3 into absorption layer 5. It is also conceivable that the positions of the p-contact region 3 and the n-contact region 4 the swapped, i.e. n-contact region 4 may form the top region of the photodiode 10 while the p-contact region 3 forms a lower region.

Figure 2:
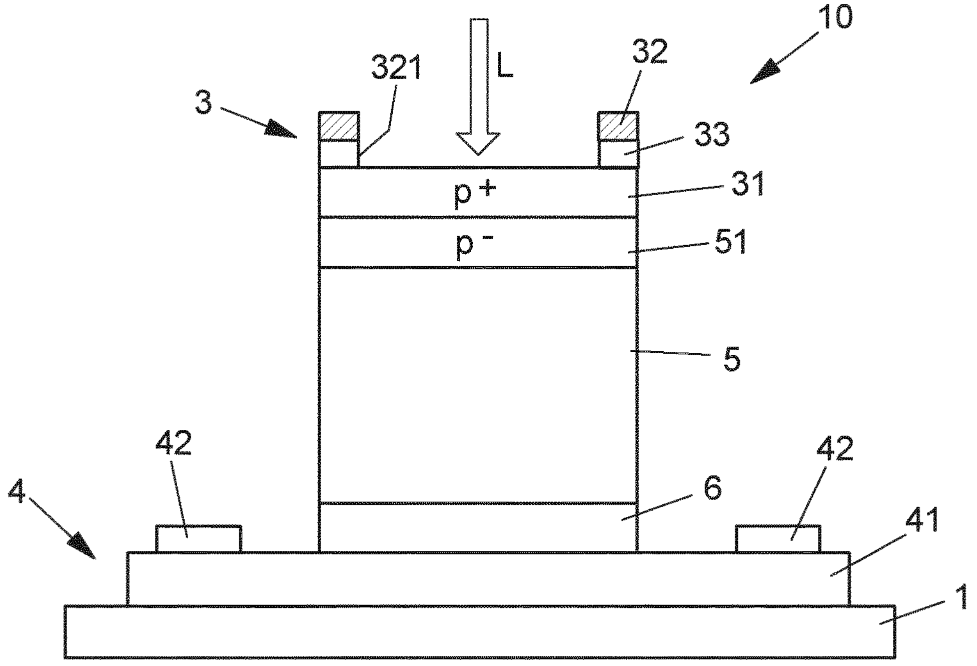
FIG. 2 shows schematically a sectional view of a photodiode according to a second embodiment of the solution.

The p-contact region 3 comprises a p-doped contact layer 31 on which a metal contact layer 32 is arranged. The metal contact layer 32 does not cover the whole surface of p-doped layer 31 to allow the light to enter the diode 10 via the p-contact layer 31. For example, the metal contact layer 31 is at least partially annularly shaped and thus provides an aperture 321 for the incoming light L. Although in FIG. 1 the metal contact layer 31 is arranged directly on the p-doped contact layer 31, this does not have to be always the case. For example, a further semiconductor layer might be arranged between the metal contact layer 32 and the p-doped contact layer 31 as shown in FIG. 2 (layer 33). The n-contact region 4 comprises at least one n-doped contact layer 41 and at least one metal contact layer 42.

The p-doped layer 31 consists of a semiconductor material that has an indirect band gap, thereby reducing or even eliminating absorption of light of lower wavelengths to be absorbed by the p-doped layer 31, i.e. before reaching the absorption layer 5. The thickness of layer 31 is at least 200 nm. For example, p-doped layer 31 consists of a composition of AlGaAsSb or AlAsSb, wherein the aluminum content may be at least 0.42. The p-contact 3 may comprise further layers in addition to p-contact layer 31, e.g. at least one layer arranged between p-contact layer 31 and absorption layer 5 and, for example, comprising a lower concentration of the p-dopant. Similarly, the n-contact 4 may comprise layers in addition to layer 41. For example, layer 41 of n-contact 4 is made of a high band gap material or similar to p-contact layer 31 of a material having an indirect band gap. For example, n-doped layer 41 consists of InAlAs or AlAsSb. Further a collector layer may be arranged between the absorption layer 5 and n-doped layer 41 as shown in FIG. 2 (layer 6). The absorption layer 5 may comprise or consist of InGaAs.

A surface illuminated photodiode 10 according to another embodiment of the solution and comprising an additional layer 51 is shown in FIG. 2. The additional layer 51 is arranged between the p-doped contact layer 31 and the absorption layer 5 (in particularly adjacent the p-doped contact layer 31 and the absorption layer 5). Additional layer 51 may be p-doped, wherein, however, the p-contact layer 31 may comprise a higher concentration of the p-dopant than layer 51, e.g. p-contact layer 31 may be a $p^+$ layer and layer 51 may be $p^{-\ layer.}$ The p-doped contact layer 31 identical to the embodiment shown in FIG. 1 comprises or consists of a material that has an indirect band gap such as AlAsSb. The additional layer 51 arranged below the contact layer 31, however, may be formed from an (at least slightly) absorbing material, e.g. from a material that does not have an indirect band gap. Layer 51 might be regarded as forming an additional absorption layer. For example, layer 51 consists of GaAsSb or InGaAs. It is also possible that a second (e.g. p-doped) additional layer is provided between the (first) additional layer 51 and the absorption layer 5, wherein the second additional layer may consist of InGaAs. Intrinsic absorption layer 5 as in the embodiment of FIG. 1 may consist of (undoped) InGaAs. Of course, more than one additional layer could be arranged between layers 51 and 5.

Further, as already mentioned above, the metal contact 32 is not arranged directly on the p-contact layer 31. Rather, the photodiode 10 comprises an intermediate layer 33 arranged between the metal contact 32 and p-doped contact layer 31. The intermediate layer 33 extends only in the region of the metal contact 32 so that it does not cover the contact layer 31 outside the region of metal contact 32 and thus also defines the aperture 321. Intermediate layer 33 may comprise or consist of InGaAs or GaAsSb.

Further deviating from the embodiment of FIG. 1, the photodiode of FIG. 2 comprises at least one collector layer 6 arranged between the absorption layer 5 and n-contact region 4. More particularly, the collector layer 6 is arranged between the absorption layer 5 and the n-doped layer 41. Collector layer 35 may be a (e.g. undoped) layer comprising a high band gap material such as InAlAs or a material having an indirect band gap. The photodiode 10 shown in FIG. 2 may realize a unique travelling carrier (UTC) photodiode structure already mentioned above.

The invention claimed is:

1. A photodiode, comprising:

a substrate formed by a III-V semiconductor material, wherein the substrate is made of InP;

at least one light absorption layer; and at least one doped contact layer, wherein the absorption layer is to be illuminated through the contact layer, and wherein the contact layer comprises a semiconductor material having an indirect band gap and has a thickness of at least 200 nm.

2. The photodiode as claimed in claim 1, wherein the contact layer is p-doped.

3. The photodiode as claimed in claim 1, wherein the contact layer comprises a semiconductor material consisting of a composition that contains Al and/or Sb.

4. The photodiode as claimed in claim 3, wherein a content of Al is at least 0.42.

5. The photodiode as claimed in claim 1, wherein a lattice mismatch of the semiconductor material of the contact layer and the semiconductor material of the substrate does not exceed +/−750 ppm.

6. The photodiode as claimed in claim 1, wherein the absorption layer comprises InGaAs or GaAsSb.

7. The photodiode as claimed in claim 6, wherein the photodiode comprises at least two absorption layers, wherein wherein one of the absorption layers is adjacent the contact layer and/or is a GaAsSb layer.

8. The photodiode as claimed in claim 1, further comprising at least one partially depleted collector layer arranged on a side of the absorption layer facing towards an n-contact layer.

9. The photodiode as claimed in claim 1, further comprising a metal contact in electrical contact with the contact layer.

10. The photodiode as claimed in claim 9, wherein the metal contact is arranged directly on the contact layer or at least one semiconductor layer is arranged between the metal contact and the contact layer.

11. The photodiode as claimed in claim 9, wherein the metal contact covers only a part of the contact layer.

12. The photodiode as claimed in claim 1, wherein the contact layer is a first contact layer and the photodiode comprises a second contact layer doped complementary to the first contact layer and arranged on a side of the absorption layer facing away from the first contact layer.

13. The photodiode as claimed in claim 12, wherein a layer with a composition grading is arranged between two undepleted layers located between the first and the second contact layer.

14. The photodiode as claimed in claim 12, wherein also the second contact layer comprises a semiconductor material having an indirect band gap.

15. A photodiode, comprising a substrate formed by a III-V semiconductor material, wherein the substrate is made of InP;

at least one light absorption layer;

at least one doped first contact layer, wherein the absorption layer is to be illuminated through the contact layer;

a second contact layer doped complementary to the first contact layer and arranged on a side of the absorption layer facing away from the first contact layer; and at least one undoped and/or partially depleted collector layer arranged on the side of the absorption layer facing towards the second contact layer, wherein the first contact layer comprises a semiconductor material having an indirect band gap and has a thickness of at least 200 nm.

16. The photodiode as claimed in claim 15, wherein the collector layer is non-absorbing regarding an absorption wavelength of the absorption layer or has a lower absorption regarding the absorption wavelength of the absorption layer than the absorption layer.

17. The photodiode as claimed in claim 16, wherein the collector layer has a band gap having a band gap energy larger than an energy corresponding to the absorption wavelength of the absorption layer.

18. The photodiode as claimed in claim 15, further comprising an additional absorption layer arranged between the first contact layer and the light absorption layer.

19. The photodiode as claimed in claim 15, wherein the photodiode has a unique travelling carrier configuration.

20. A method of fabricating a photodiode, comprising the steps of:

providing a substrate formed by a III-V semiconductor material, wherein the substrate is made of InP;

generating at least one light absorption layer on the substrate; and generating at least one doped contact layer on the substrate, wherein the absorption layer is to be illuminated through the contact layer, wherein the contact layer comprises a semiconductor material having an indirect band gap and has a thickness of at least 200 nm.

* * * * *